(12) United States Patent
De Macedo (10) Patent No.: US 11,945,356 B2
(45) Date of Patent: Apr. 2, 2024

(54) UNMANNED MOBILE VEHICLE CONFIGURABLE AS AN AUTONOMOUS POWER MODULE

(71) Applicant: Giuliano Aguirra Pilagallo, Paraná (BR)

(72) Inventor: Melissa Franco Maeder De Macedo, Paraná (BR)

(73) Assignee: Giuliano Aguirra Pilagallo, Curitiba (BR)

( * ) Notice: Subject to any disclaimer, the term of this patent is extended or adjusted under 35 U.S.C. 154(b) by 367 days.

(21) Appl. No.: 17/441,126

(22) PCT Filed: Mar. 18, 2020

(86) PCT No.: PCT/BR2020/050094
§ 371 (c)(1),
(2) Date: Sep. 20, 2021

(87) PCT Pub. No.: WO2020/186325
PCT Pub. Date: Sep. 24, 2020

(65) Prior Publication Data
US 2022/0161705 A1    May 26, 2022

(30) Foreign Application Priority Data
Mar. 21, 2019   (BR) .......................... 1020190055774

(51) Int. Cl.
*B60L 53/51*      (2019.01)
*B60J 5/04*      (2006.01)
(Continued)

(52) U.S. Cl.
CPC .............. *B60P 3/0257* (2013.01); *B60J 5/04* (2013.01); *B60K 1/00* (2013.01); *B60K 17/02* (2013.01);
(Continued)

(58) Field of Classification Search
CPC .... B60J 5/04; B60L 1/00; B60L 8/003; B60L 50/60; B60L 53/51; B62D 7/00; B62D 21/00; B62D 25/02; G09F 21/048
See application file for complete search history.

(56) References Cited

U.S. PATENT DOCUMENTS

2004/0182613 A1*   9/2004   Lin ........................ B60L 50/52
                                                                                                              180/2.2
2007/0144799 A1   6/2007   Vasant
(Continued)

FOREIGN PATENT DOCUMENTS

BR      102012006480 A2      4/2015
BR      202015026120-4 U2      10/2015
(Continued)

OTHER PUBLICATIONS https://robomart.co/about.
(Continued)

*Primary Examiner* — Erez Gurari
(74) *Attorney, Agent, or Firm* — Hahn Loeser & Parks LLP; Bret A. Hrivnak (57) ABSTRACT

The present invention relates to an unmanned (100) and configurable as a standalone energy module mobile vehicle, which comprises: one chassis (1) a body (27) mounted on the chassis (1) a drive system (4) comprising a motor (51), the drive system (4) configured to receive commands from a user-operated controller, the vehicle (100) comprising at least a rechargeable battery module (80) configured to feed the motor (51) and provide a source of electrical energy.

16 Claims, 7 Drawing Sheets

(51) Int. Cl.

| | |
|---|---|
| *B60K 1/00* | (2006.01) |
| *B60K 17/02* | (2006.01) |
| *B60K 17/24* | (2006.01) |
| *B60K 17/342* | (2006.01) |
| *B60L 1/00* | (2006.01) |
| *B60L 8/00* | (2006.01) |
| *B60L 50/60* | (2019.01) |
| *B60P 3/025* | (2006.01) |
| *B62D 7/00* | (2006.01) |
| *B62D 21/00* | (2006.01) |
| *B62D 25/02* | (2006.01) |
| *G09F 9/30* | (2006.01) |
| *G09F 21/04* | (2006.01) |

(52) U.S. Cl.
CPC ............ *B60K 17/24* (2013.01); *B60K 17/342* (2013.01); *B60L 1/00* (2013.01); *B60L 8/003* (2013.01); *B60L 50/60* (2019.02); *B60L 53/51* (2019.02); *B60P 3/0255* (2013.01); *B62D 7/00* (2013.01); *B62D 21/00* (2013.01); *B62D 25/02* (2013.01); *G09F 9/30* (2013.01); *G09F 21/048* (2013.01)

(56) References Cited

U.S. PATENT DOCUMENTS

| | | | |
|---|---|---|---|
| 2009/0200096 A1* | 8/2009 | Pittman | B62M 6/85 |
| | | | 180/205.5 |
| 2010/0170727 A1* | 7/2010 | Hsu | B60L 8/006 |
| | | | 180/2.2 |
| 2014/0165524 A1* | 6/2014 | Schygge | B60L 1/16 |
| | | | 180/62 |
| 2015/0035307 A1 | 2/2015 | Hixson et al. | |
| 2015/0042118 A1 | 2/2015 | Cohen et al. | |
| 2019/0034858 A1* | 1/2019 | Ferguson | G05D 1/0088 |
| 2021/0072751 A1* | 3/2021 | Gillett | B60K 7/0007 |
| 2021/0101477 A1* | 4/2021 | Gaither | F16D 41/00 |
| 2021/0129699 A1* | 5/2021 | Luoma | H02J 7/14 |
| 2021/0200213 A1* | 7/2021 | Gillett | G01S 13/931 |
| 2021/0252972 A1* | 8/2021 | Engerman | B60K 17/02 |
| 2022/0410994 A1* | 12/2022 | Arya | B60K 6/36 |
| 2022/0411018 A1* | 12/2022 | Vaisanen | B60L 15/2009 |

FOREIGN PATENT DOCUMENTS

| | | |
|---|---|---|
| CN | 202966074 U | 6/2013 |
| WO | 2017063058 A1 | 4/2017 |

OTHER PUBLICATIONS

"Toyota e-Palette—Autonomous electric vehicle demonstration in Toyota City, Japan." Youtube, Dec. 22, 2020. <https://www.youtube.com/watch?v=Sn3zY6QpLKU>.

* cited by examiner

UNMANNED MOBILE VEHICLE CONFIGURABLE AS AN AUTONOMOUS POWER MODULE

TECHNICAL FIELD

The present invention relates to the field of unmanned mobile vehicles. More specifically, the present invention is about an unmanned mobile vehicle configurable as an autonomous energy module to operate as an electric power generation unit from renewable and sustainable energy sources.

DESCRIPTION OF THE STATE OF THE ART

The large supply of products and services and the increased competitiveness in the market have modernized the way business is done. Often the public and private places in cities, considering both their internal and external spaces, do not have an adequate energy infrastructure to enable the delivery of products such as food, beverages, medicines, vaccines, etc., and the provision of services with quality and safety.

The state of the art is full of vehicles for the provision of services and preparation and/or sale of products in public places such as streets, squares, parks, and beaches. In these places it is very difficult to maintain and sell products and even provide good quality services, due to gas, water, and electricity supply problems, for example.

These infrastructure difficulties cause problems in the conservation of ingredients, but also of the final products themselves, which often require adequate refrigeration. Difficulties with maintenance and the supply of gases and electrical power needed for operations are also very frequent. The limitations described cause momentary interruptions of the activities until these supplies are reestablished, as well as other problems of minor importance, but which imply in the poor performance of these activities, as well as can cause product waste, rework, and sanitary safety problems, as well as other non-conformities.

In this regard, document MU7301255-6 discloses a vehicle for the itinerant sale of light meals comprising a prismatic housing, mounted on two wheels, provided with a handle and which stores a gas or electric oven and stove assembly and, if applicable, a gas cylinder and a refrigeration compartment; this housing defines a space for product storage and its upper side constitutes a counter, on which an umbrella or awning is mounted. This vehicle moves exclusively through human effort, being pushed to the desired location. This limits the distance the operator can transport the vehicle, since transport generates considerable physical effort for the operator. In addition, such a vehicle does not have power sources that make it possible to operate more robust devices of a business, comprising only a gas cylinder to light a stove.

The Robomart vehicle (https://robomart.co/about.html accessed 18 Mar. 2019) is a road/urban vehicle powered by electric batteries and has autonomous navigation. This vehicle is designed for deliveries of products by an application and without the use of a driver.

The e-Palette vehicle (https://www.turbo.en/toyota-e-pallete/, accessed 18 Mar. 2019) is an autonomous electric vehicle that transports products.

Among mobile stores, there has been a great growth of stores onboard traditional medium-sized vehicles, the so-called food-trucks. Food trucks have a restaurant built into a vehicle, which usually has equipment for preparing food, the food-truck operator is inside the vehicle, presenting him/herself to the consumer as an attendant behind a counter.

Although food trucks are capable of reaching many different types of environments, they have all the access limitations that a vehicle has. Specifically, the food-truck operator will necessarily need a driver's license appropriate to the size of the vehicle that has been adapted. In addition, food-trucks have limited access to places that are not accessible by road. Nevertheless, some places have specific legislation that limits the access of food trucks in certain locations, such as squares, parks, and beaches.

Thus, although the state of the art reveals some documents dealing with vehicles for mobile sales and services, none of them reveal a mobile vehicle configured to generate clean, renewable energy to meet the energy demand needs for finishing, distribution, commercialization, transportation of products, and the provision of public and private services.

Objectives of the Invention

The object of the present invention is to provide an unmanned mobile vehicle that has an electrical power generation system.

It is a further object of the present invention to provide an unmanned mobile vehicle adapted to receive components of a mobile store, so that the vehicle can operate as an independent business in regions where there are no adequate power sources and infrastructure for a conventional store.

BRIEF DESCRIPTION OF THE INVENTION

The present invention discloses an unmanned configurable as an autonomous energy module mobile vehicle, which comprises a chassis, a body mounted on the chassis, a drive system comprising a motor, the drive system configured to receive commands from a user operable controller. The unmanned and configurable as an autonomous energy module mobile vehicle is especially advantageous as it comprises at least one rechargeable battery module configured to power the motor and provide an electrical power source.

The unmanned mobile vehicle can have spaces in its body that can be used as advertising media spaces.

The unmanned mobile vehicle can include a computer system that supports applications and software for geolocation tracking (GPS) remote locking, and power and operation monitoring.

BRIEF DESCRIPTION OF THE FIGURES

The figures of the unmanned, configurable mobile vehicle as an autonomous energy module are briefly described as shown below.

DETAILED DESCRIPTION

The following description will start from a preferred embodiment of the invention, applied to an unmanned and configurable as an autonomous energy module mobile vehicle.

The present invention features an unmanned and configurable as an autonomous energy module mobile vehicle, which comprises a chassis, a body mounted on the chassis, a drive system comprising a motor, the drive system configured to receive commands from a user operable controller, the vehicle still comprising at least one rechargeable battery module configured to power the motor and provide an electrical power source.

Figure 1:
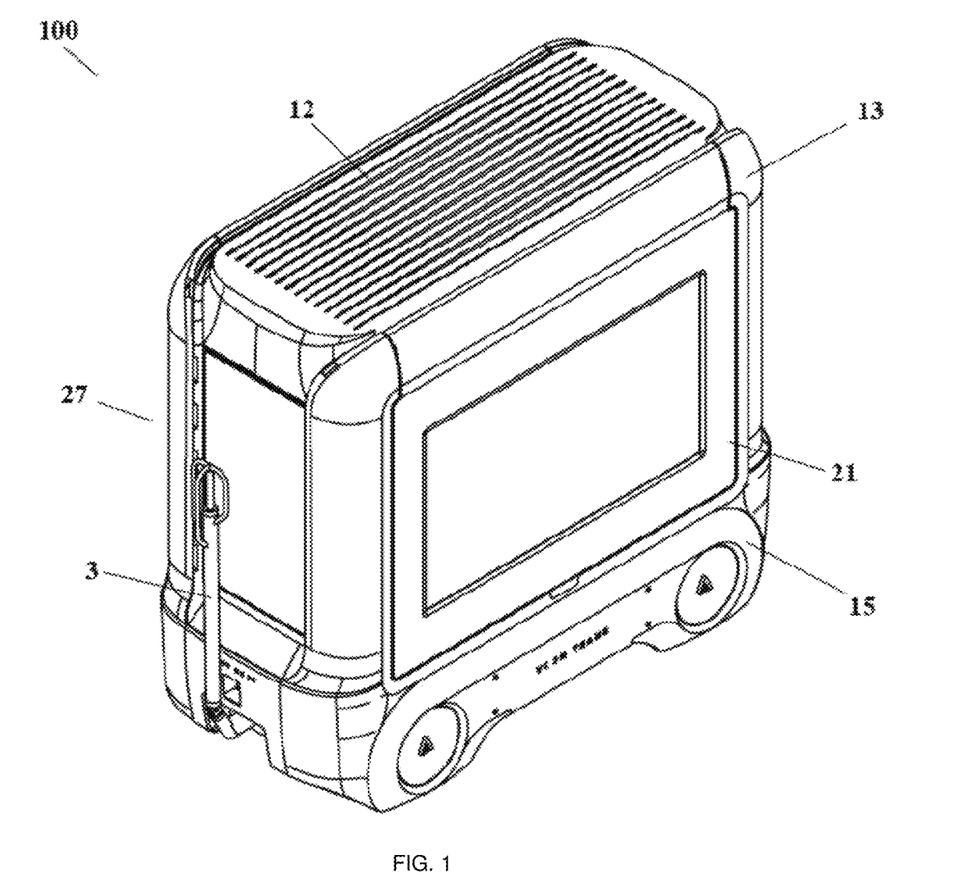
FIG. 1—Perspective view of an unmanned mobile vehicle configurable as an autonomous energy module.

An example of an unmanned and configurable as an autonomous energy module mobile vehicle is illustrated in FIG. 1. The chassis of the unmanned mobile vehicle has a tubular structure and can be made of galvanized, zinc-plated, or stainless steel metal, steel, stainless steel, fiberglass, injected plastic, aluminum, acrylic, polycarbonate, polymer obtained by thermoforming by Vacuum Forming, in PVC, PET, PP, PS, HDPE, plastic alloyed and/or light alloyed materials.

Figure 2:
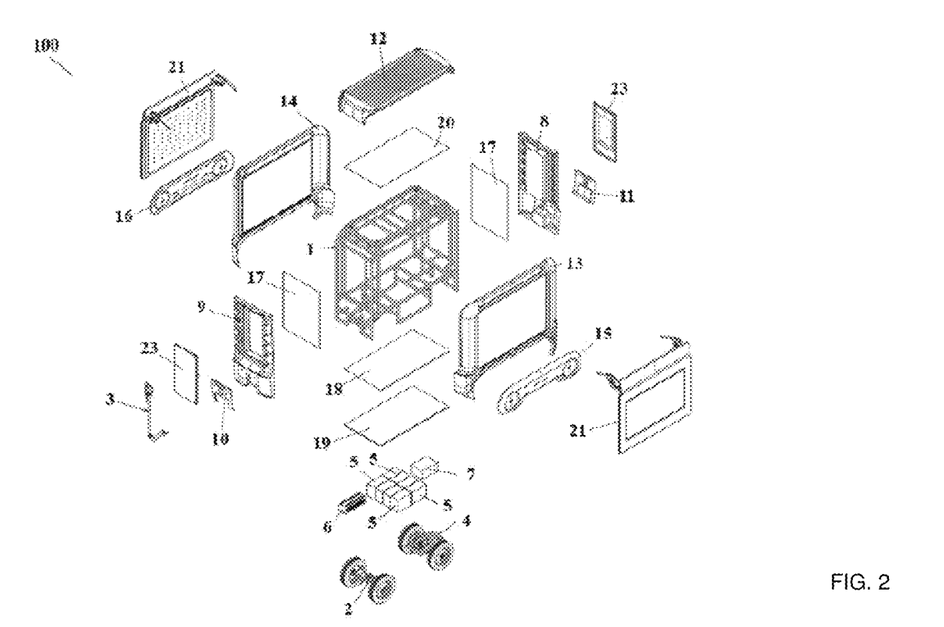
FIG. 2—Exploded view of an unmanned mobile vehicle configurable as an autonomous energy module.

FIG. 2 illustrates an exploded view of a preferred embodiment of the present invention in which an unmanned and configurable as an autonomous energy module mobile vehicle. In this embodiment, the unmanned mobile vehicle 100 comprises a chassis 1, a body 27 mounted on the chassis 1, a drive system 4 comprising a motor 51, the drive system 4 receiving commands from a user-operable controller.

Furthermore, the vehicle 100 additionally comprises at least one mobile store module 90 adapted to receive a mobile store component and at least one power source capable of powering the motor 51 and the mobile store components housed in the mobile store module 90.

In this embodiment, the body 27 of the unmanned mobile vehicle 100 comprises side panels 13, 14 that have a rectangular shape with rounded edges, a rear panel 8, a front panel 9, a front cover 10, and a rear cover 11. Preferably, the cover 10 and the back cover 11 are attached to the front panel 9 and the back panel 8, respectively.

The body 27 further comprises hubcaps 15, 16 coupled to side panels 13, 14, side inner liners 17, whereby each side inner liner 17 is positioned between chassis 1 and rear panel 8 or is positioned between chassis 1 and front panel 9. Also, the body 27 includes a lower inner liner 18 and a bottom plate 19 made of plywood material positioned on the lower portion of the chassis 1.

The body 27 further comprises an inner roof liner 20 positioned below a solar panel 12, which is mounted on top of the body 27.

Additionally, the body 27 includes hinged side doors 21. Preferentially, such hinged side doors 21 are attached to the upper portion of the side panels 13, 14. The body 27 also includes at least one electronic display panel 23 to display advertising information. Preferentially, the front and rear portions of the body 27 comprise display panels 23.

In addition, side doors 21 can also include side panels 23. The advertising information displayed on the display panels 23 may be related to the products and services offered through the use of the Unmanned Mobile Vehicle 100 or related to other products and services.

The user-operable controller of the unmanned mobile vehicle 100 comprises a control rod 3 attached to the chassis 1. Control rod 3 includes a tubular bar and an electric handle with buttons to control the movement of the vehicle 100.

Preferentially, the control rod 3 of the user-operable controller is coupled to a steering system 2 to steer the wheels of the vehicle 100, thereby steering such wheels to the left and right by means of commands sent to the user-operable controller.

According to a preferred embodiment of the present invention, the unmanned mobile vehicle 100 has three main sizes: small, medium and large. The small model has a volumetric capacity of 1.29 m$^3$/1,201 liters, weight of 600 kg and dimensions of 1.70 m long, 1.45 m high, and 0.80 m wide. The side panels 21 of the small model are 0.86 m high and 1.24 m long, while the front 9 and rear 8 panels are 1.23 m high and 0.39 m long. The display panels 23 arranged on the side panels 21 in the small model are 1.20 m long and 0.50 m high, while the display panels 23 arranged on the front 8 and rear 9 are 0, 30 m long and 0.80 m high. The wheels of the 100 vehicle in the small model are 40 cm in diameter. In this model, solar panel 12 is 1.09 m long and 0.70 m wide. The user-operable controller of the Unmanned Mobile Vehicle 100 features a shape similar to that of an oar, it is 0.24 m wide, 0.75 m long, and 0.10 m thick, and its control rod 3 is 1.08 m long.

Alternatively, the medium model 100 unmanned mobile vehicle has a volumetric capacity of 1.43 m$^3$/1,434 liters, a weight of 1000 kg, and dimensions of 1.90 m long, 1.77 m high, and 0.95 m wide. Side panels 21 comprise 0.86 m high and 1.24 m long side windows, while the front and rear windows attached to the front 9 and rear 8 panels are 1.23 m high and 0.49 m long. The display panels 23 arranged on the side panels 21 in the middle model are 1.20 m long and 0.60 m high, while the display panels 23 arranged in front 8 and rear 9 are 0.40 m long and 0.80 m high. The wheels of the average 100 vehicle are 40 cm in diameter. In the medium model, solar panel 12 is 1.09 m long and 0.70 m wide. The user-operable controller of the 100 mobile unmanned vehicle has a shape similar to that of an oar, being 0.24 m wide, 0.75 m long, and 0.10 m thick and its control rod 3 is 1.08 m long.

In another alternative configuration, the large model 100 unmanned mobile vehicle has a volumetric capacity of 3.10 m$^3$/3,104 liters, weight of 1,500 kg, and dimensions of 2.46 m long, 2.10 m high, and 1.28 m wide. In this large model, side panels 21 comprise side windows 1.23 m high and 2.05 m long, while the front and rear windows attached to front panels 9 and rear panel 8 are 1.23 m high and 0.84 m long. Display panels 23 arranged on side panels 21 are 2.20 m long and 1.10 m high, while display panels 23 arranged on front 8 and rear 9 are 0.78 m long and 1.00 m high. The wheels of the large model vehicle are 56 cm in diameter. Solar panel 12 is 1.60 m long and 1.07 m wide. The user-operable controller of the Unmanned Mobile Vehicle 100 features a shape similar to that of an oar, it is 0.24 m wide, 0.75 m long, and 0.10 m thick, and its control rod 3 is 1.08 m long. Optionally, the user-operable controller can comprise a joystick or a remote control.

It is important to note that the above configurations are only practical examples for manufacturing the unmanned mobile vehicle 100 of the present invention. A technician on the subject will note that other sizes are perfectly possible to manufacture, according to the vehicle's application needs.

Figure 3:
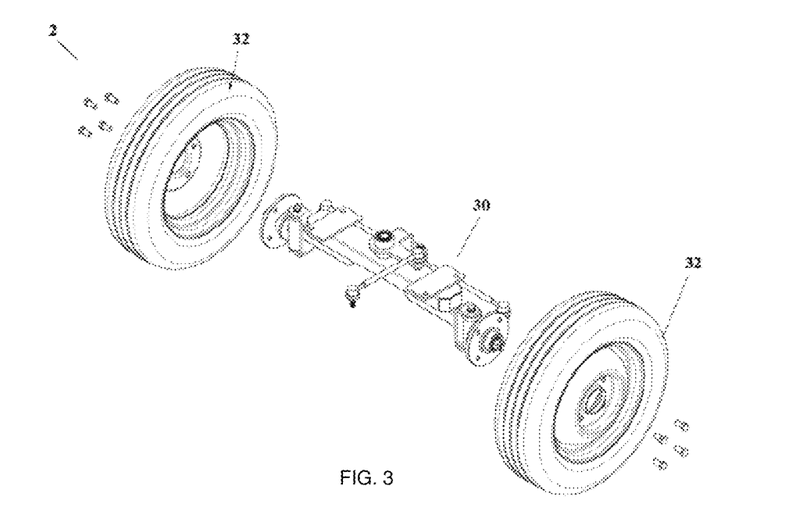
FIG. 3—Perspective view of a steering system of a unmanned and configurable as an autonomous energy module mobile vehicle.
Figure 4:
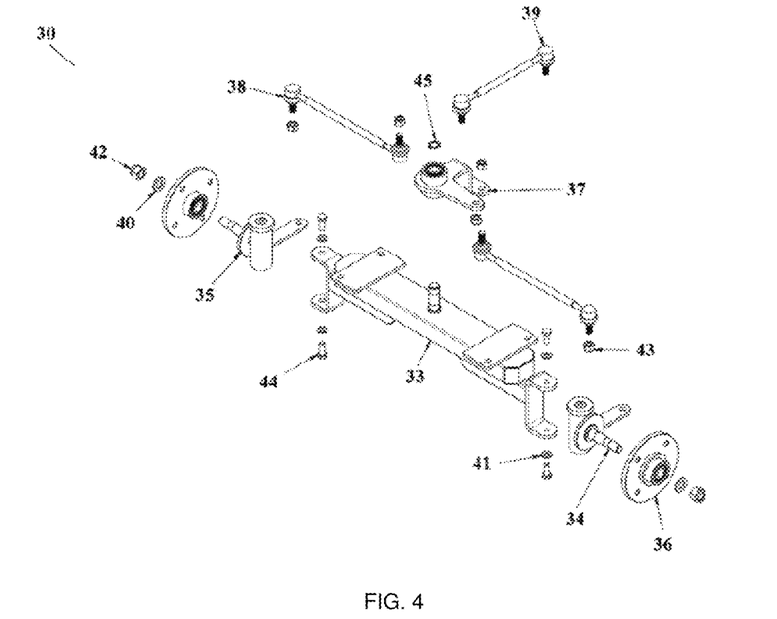
FIG. 4—Exploded view of a steering system of an unmanned and configurable as an autonomous energy module mobile vehicle.

FIGS. 3 and 4 illustrate the steering system 2 of the 100 unmanned mobile vehicle. Steering system 2 comprises a front axle assembly 30, where tires 32 are attached to the ends of such front axle assembly 30. The front axle assembly 30 still includes a front axle 33, a left end 34 and a right end 35 pivotally attached to the ends of the front axle 33.

Furthermore, wheel hubs 36 are attached to the left end 34 and right end 35 by means of bolted joints comprising washers 40 and self-locking nuts 42. The ends 34, 35 are attached to the front axle 33 by means of bolts 44 and washers 41.

The steering system 2 also includes a connecting rod bracket 37 attached to the front axle 33, wherein the connecting rod bracket 37 comprises an elastic ring 45 and is pivotally coupled to first connecting rods 38 and a second connecting rod 39. The first connecting rods 38 are attached to the left end 34 and right end 35 by means of self-locking nuts 43.

In this way, the wheel hubs 36 can rotate together from the ends 34, 35 around the pivot shaft of the front axle end 33, making it possible to turn the front wheels of the vehicle 100.

Figure 5:
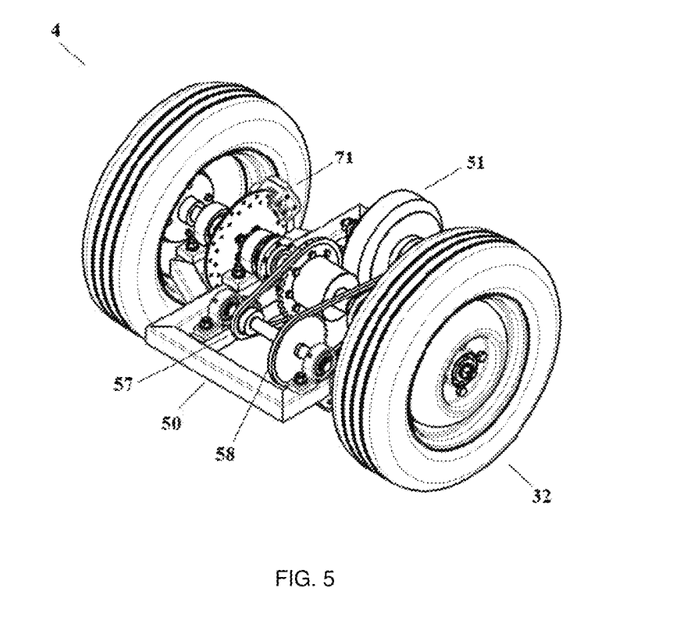
FIG. 5—Perspective view of a drivetrain system of a unmanned and configurable as an autonomous energy module mobile vehicle.
Figure 6:
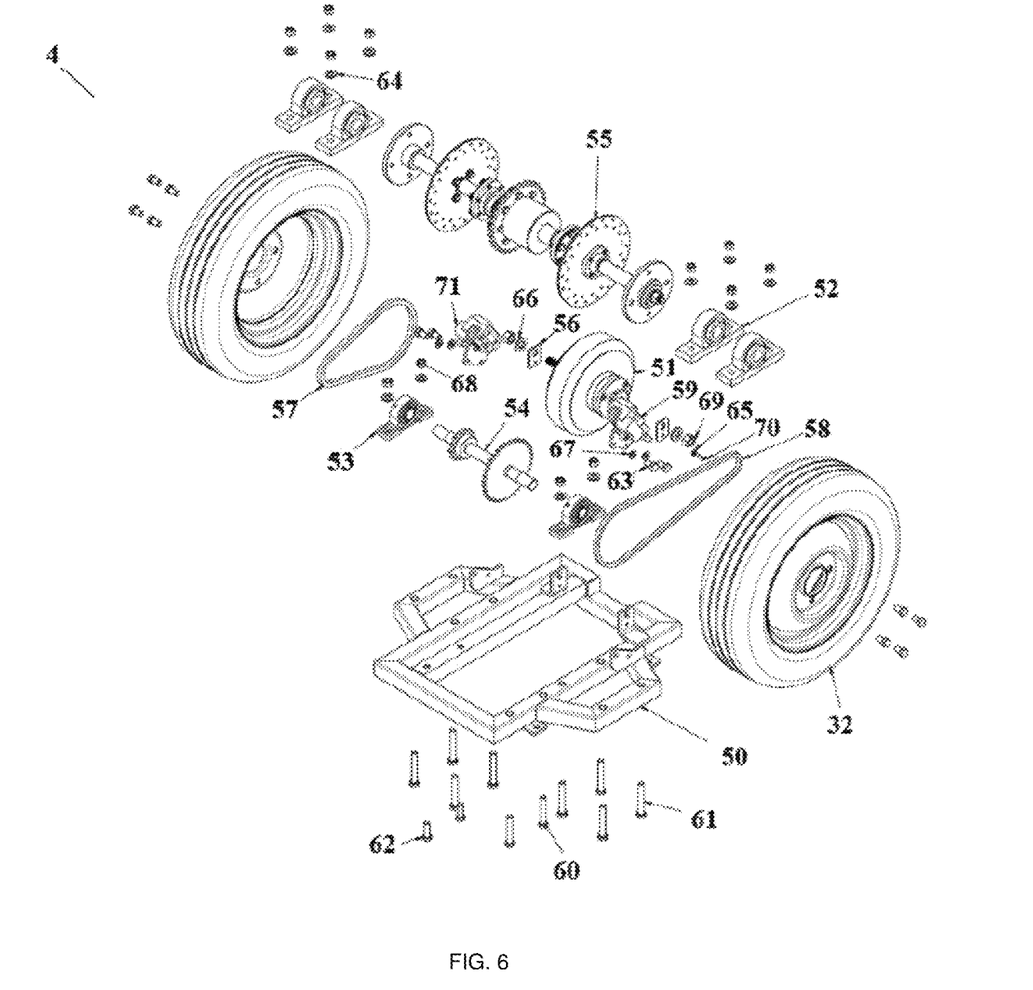
FIG. 6—Exploded view of a drivetrain system of an unmanned and configurable as an autonomous energy module mobile vehicle.

FIGS. 5 and 6 exemplify the drive system 4 of the unmanned mobile vehicle 100. The drive system 4 includes a rear axle 55 coupled with tires 32 at its ends and being supported on rear axle bearings 52 and an intermediate axle 54 with sprockets supported on intermediate axle bearings 53.

Drive system 4 also comprises a base 50 configured to support bearings 52, 53, and motor 51. The base 50 of the drive system 4 is attached to the chassis 1 of the vehicle 100. Preferentially, the bearings 52, 53 are secured to the base 50 by bolted joints comprising bolts 60, 61, 62, 63, 70, nuts 68, 69 and washers 64, 65, 66, 67.

The drive system 4 further comprises a first roller chain 58 configured to transmit motion from the motor 51 to the intermediate shaft 54, and a second roller chain 57 configured to transmit motion from the intermediate shaft 54 to the rear axle 52. The drive system 4 includes brake calipers 59, 71 configured to be releasable and lock the rear axle 55, making it possible to stop the vehicle 100.

In addition, a clutch system coupled to the 51 motor. Optionally, the drive system 4 may include means to generate electrical power through the movement of the wheels, for example a dynamo or a kinetic energy recovery system (kinetic energy recovery system—KERS).

Figure 7:
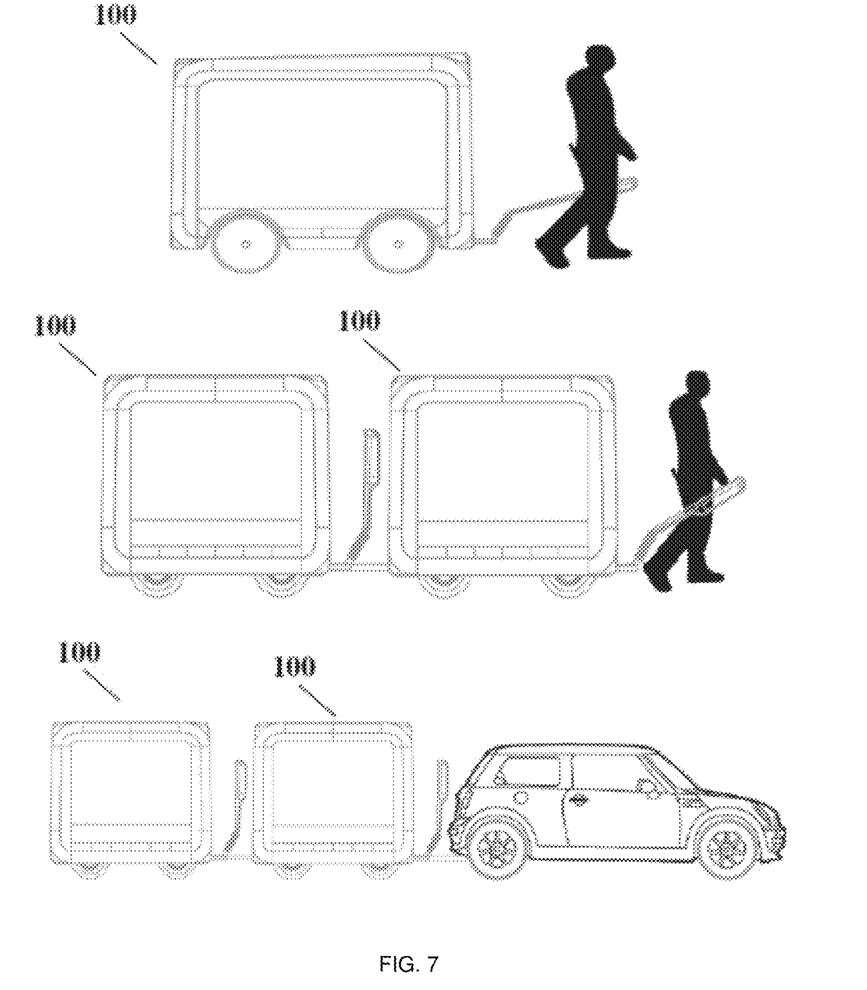
FIG. 7—Illustrative views of mobile unmanned vehicles in transit.

FIG. 7 illustrates the unmanned mobile vehicle 100 being displaced. An operator, who walks alongside the vehicle 100, sends commands to the user-operable controller via control rod 3. Optionally, more than one unmanned mobile vehicle 100 can be operated by the same user. In this case, such vehicles 100 are engaged with each other by the control rod 3 of the user-operable controller. For example, this configuration is interesting in the situation where a first unmanned mobile vehicle is used as a mobile store and the second vehicle is used as a mobile product stock to supply the mobile store of the first vehicle. Alternatively, two unmanned mobile vehicles are hooked up to each other and are transported by a car.

Figure 8:
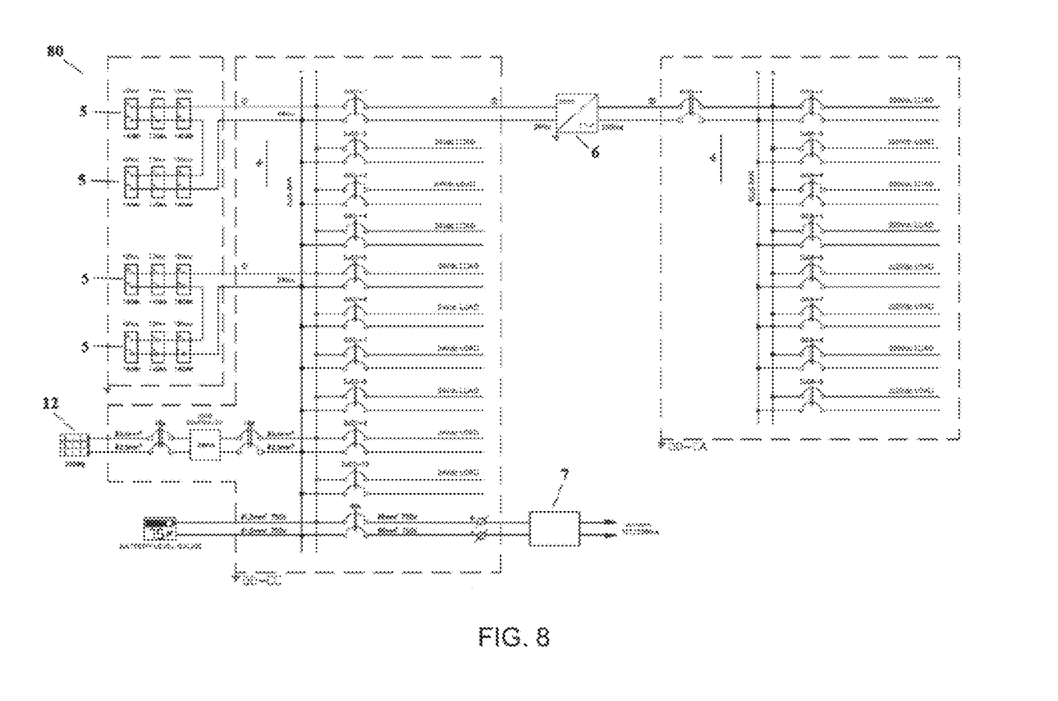
FIG. 8—Block diagram of a solar and electric based rechargeable battery module for an unmanned and configurable as an autonomous energy module mobile vehicle.

FIG. 8 illustrates the solar and electric based rechargeable battery module 80 of the unmanned mobile vehicle 100. The rechargeable battery module 80 provides a source of electrical power and powers the motor 51 of the drive system 4.

Therefore, the rechargeable battery module 80 serves as the power source for the vehicle 100, enabling the vehicle 100 to operate autonomously and self-sustainably, especially in regions where there are no adequate power sources and infrastructure for the operation of conventional stores.

The solar and electric based rechargeable battery module 80 comprises the solar panel 12, a plurality of electric batteries 5, a power generating device 6 and a charger 7. The charger 7 makes it possible to recharge the batteries 5 independently of the use of the solar panel 12.

In addition, the power generating device 6 can comprise a direct current to alternating current converter, i.e. a DC/AC converter. In this way, the rechargeable battery module 80 can provide both direct current outputs (DC), as well as alternating current outputs (AC). In this embodiment, solar panel 12 is mounted on top of body 27. Optionally, the side doors 21 can comprise solar panels 12.

Preferentially, the rechargeable battery module 80 includes 8 to 12 140 Ah and 1680 W batteries. However, a technician on the subject will note that the amount and power of the batteries will vary according to the electrical demand, as well as the size of the vehicle.

Additionally, the vehicle 100 comprises a computer system that supports applications and software for geolocation tracking (GPS) remote locking, and power and operation monitoring. Preferentially, the computer system of the vehicle 100 is integrated with cell phone applications, in order to provide greater comfort and convenience for consumers.

For example, vehicle 100 may have a GPS system to report its location to the operator of vehicle 100, and also to consumers registered in a database of the vehicle operator. Users could, for example, register through a cell phone application, where he/she could locate the vehicle on the map.

In this embodiment, users could also access the list of products offered by the vehicle 100 and request an order within a pre-determined distance from it. Upon a new request, the vehicle operator could go to the position of the user that is requesting a product in order to serve him/her.

Figure 9:
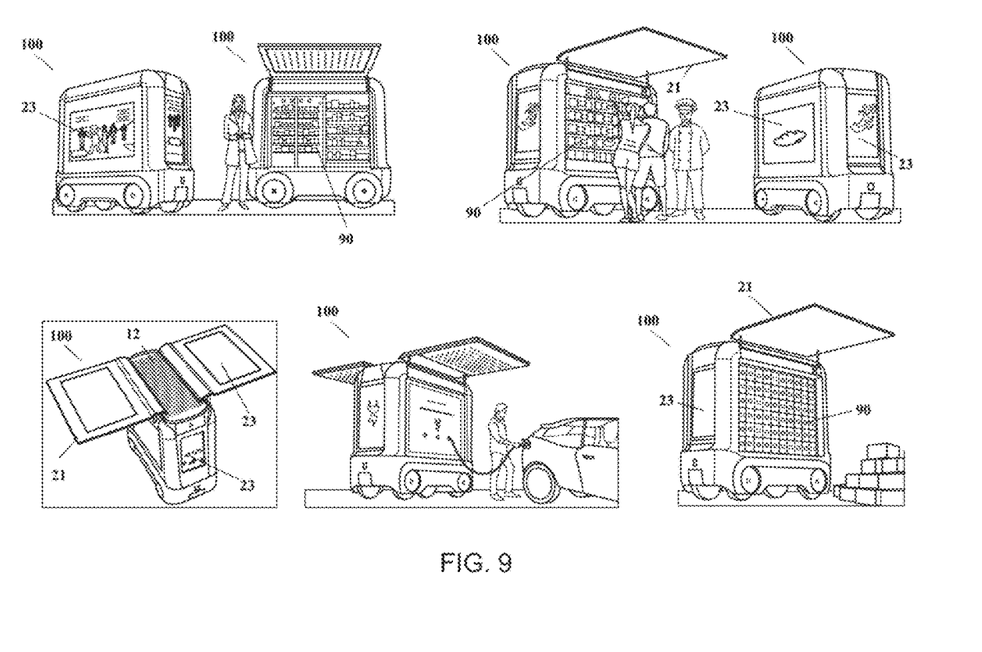
FIG. 9—Illustrative views of unmanned mobile vehicles operating for the completion, distribution, marketing, transportation of products, and provision of public and private services.
Figure 10:
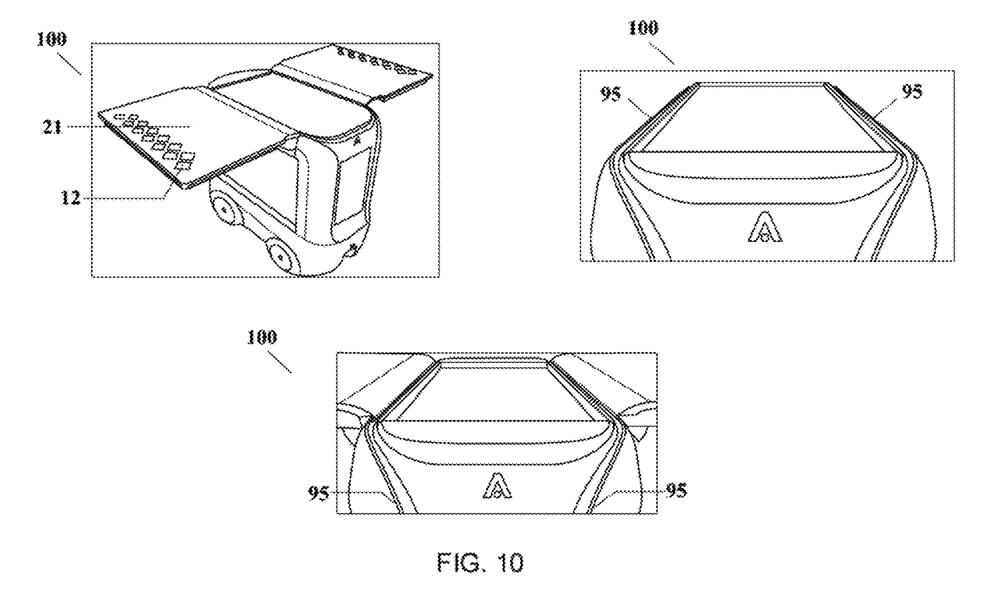
FIG. 10—Illustrative views of unmanned and configurable as autonomous energy modules mobile vehicles.

FIGS. 9 and 10 illustrate alternative embodiments of the unmanned vehicle 100. In these alternative embodiments, the vehicle 100 comprises at least one mobile store module 90 adapted to receive a mobile store component. The at least one rechargeable battery module 80 of the vehicle 100 provides electrical power necessary for the operation of the mobile store component of the at least one mobile store module 90.

FIG. 9 exemplifies the use of the unmanned mobile vehicle 100 as a vending machine, where a consumer's interaction with the vehicle operator could be dispensed with. The vending machines could store and make available for sale, products, such as candies, jewelry, electronic gadgets, and souvenirs.

In addition, the unmanned mobile vehicle 100 can be used to provide public health services, such as vaccines, condoms, and information booklets. The electrical power source provided by the rechargeable battery module 80 of the vehicle 100 can also be used to recharge electrical and electronic devices such as cell phones and electric vehicles.

The present invention is also advantageous since the unmanned mobile vehicle 100 is capable of being integrated into several other market branches, promoting cross-selling.

The electronic display panels can be arranged in the front, rear and sides of the body 27.

These display panels can be used to provide advertising information, either about products and services offered by the vehicle, or about products and services offered by third parties. Also optionally, the display panels 23 can show general information regarding news, time, temperature, tourist information, among others.

Preferentially, display panels 23 consist of LED panels installed on at least one of the front, rear, and sides of the vehicle. However, a subject matter expert will note that other display media can be used, such as LCD monitors. Thus, the 100 vehicle can also have a "mobile billboard" function, taking advantage of its structure and bodywork for publicity, sales promotion, and product launches.

FIG. 10 illustrates embodiments of the unmanned mobile vehicle 100 comprising a body with gutters 95 for water runoff.

Numerous variations falling within the protective scope of the present invention are permissible. The unmanned mobile vehicle 100 of the present invention has an application of special interest in the field of electric power generation. Optionally, the unmanned mobile vehicle 100 has application in the field of mobile stores, where an operator drives the vehicle to a location of interest, where he/she would start the desired end activity.

However, the unmanned mobile vehicle of the present invention can be used to transport and accommodate the most diverse products, serving as a tool to assist the most diverse operational flows of market segments, i.e. logistics. Thus, it is reinforced that the present invention is not limited to the particular configurations/concretizations described above.

The invention claimed is:

1. An unmanned and configurable autonomous energy module mobile vehicle (100), which comprises:
    a chassis;
    a body mounted on the chassis;
    a drive system;
    characterized in that the drive system comprises a motor, a rear axle supported on rear axle bearings, and a sprocketed intermediate axle supported on intermediate axle bearings; a base configured to support the motor and being coupled to the chassis, and wherein the bearings are attached to the base, the drive system configured to receive commands from a user-operable controller;
    at least one rechargeable battery module configured to power the motor and provide an electrical power source.

2. The unmanned mobile vehicle according to claim 1, characterized in that the chassis has a tubular frame.

3. The unmanned mobile vehicle according to claim 1, characterized in that the chassis is manufactured from a material selected from the group consisting of: galvanized, zinc-plated or stainless steel metal, steel, stainless steel, fiberglass, injected plastic, aluminum, acrylic, polycarbonate, polymer obtained by Vacuum Forming thermoforming, PVC, PET, PP, PS, HDPE, plastic alloyed and/or light alloyed materials.

4. The unmanned mobile vehicle according to claim 1, characterized in that the body comprises side panels.

5. The unmanned mobile vehicle according to claim 1, characterized in that the vehicle has dimensions in the range of 1.70 m to 2.46 m in length, 1.45 m to 2.10 m in height, and 0.80 m to 1.28 m in width.

6. The unmanned mobile vehicle according to claim 1, characterized in that the body comprises hinged side doors.

7. The unmanned mobile vehicle according to claim 1, characterized in that the drive system additionally comprises:
    a first roller chain configured to transmit motion from the motor to the intermediate shaft;
    a second roller chain configured to transmit motion from the intermediate shaft to the rear axle;
    brake calipers configured to be releasable and lock the rear axle; and
    a clutch system coupled to the motor.

8. The unmanned mobile vehicle according to claim 7, characterized in that the bearings are attached to the base by bolted joints comprising bolts, nuts and washers.

9. The unmanned mobile vehicle according to claim 1, characterized in that it additionally comprises a steering system comprising front axle assembly, wherein the front axle assembly includes:
    a front axle;
    a left end and a right end pivotally coupled to the ends of the front axle;
    wheel hubs attached to the left and right ends by means of bolted joints comprising washers and self-locking nuts; and
    a connecting rod bracket fixed to the front axle, wherein the connecting rod bracket comprises an elastic ring and is pivotally coupled to the first connecting rods and a second connecting rod, and wherein the first connecting rods are coupled to the left and right ends by means of self-locking nuts.

10. The unmanned mobile vehicle according to claim 9, characterized in that it comprises tires coupled to the front and rear axles.

11. The unmanned mobile vehicle according to claim 1, characterized in that the rechargeable battery module comprises a solar panel, electric batteries, a power generating device and a charger, wherein the solar panel is mounted on top of the body.

12. The unmanned mobile vehicle according to claim 1, characterized in that the user operable controller comprises a control rod coupled to the chassis, wherein the control rod comprises a tubular bar and an electric joystick with buttons for controlling the movement of the vehicle, or the user operable controller comprises a joystick or a remote control.

13. The unmanned mobile vehicle according to claim 1, characterized in that the vehicle comprises a computer system that supports applications and software for geolocation tracking (GPS), remote locking, and power and operation monitoring.

14. The unmanned mobile vehicle according to claim 1, characterized in that it comprises at least one electronic display panel arranged on the side panel, front panel or rear panel of the body of the vehicle for displaying advertising information.

15. The unmanned mobile vehicle according to claim 1, characterized in that it comprises at least one mobile store module adapted to receive a mobile store component.

16. The unmanned mobile vehicle according to claim 15, characterized in that the at least one rechargeable battery module provides electrical power to the mobile store component of the at least one mobile store module.

* * * * *